(12) United States Patent
Park et al.

(10) Patent No.: US 8,722,491 B2
(45) Date of Patent: May 13, 2014

(54) REPLACEMENT METAL GATE SEMICONDUCTOR DEVICE FORMATION USING LOW RESISTIVITY METALS

(75) Inventors: Chang Seo Park, Clifton Park, NY (US); Vimal K. Kamineni, Albany, NY (US)

(73) Assignee: GLOBALFOUNDRIES Inc., Grand Cayman (KY)

(*) Notice: Subject to any disclaimer, the term of this patent is extended or adjusted under 35 U.S.C. 154(b) by 0 days.

(21) Appl. No.: 13/603,726

(22) Filed: Sep. 5, 2012

(65) Prior Publication Data

US 2014/0065811 A1   Mar. 6, 2014

(51) Int. Cl.
| | |
|---|---|
| *H01L 21/8234* | (2006.01) |
| *H01L 21/3205* | (2006.01) |
| *H01L 21/4763* | (2006.01) |
| *H01L 21/336* | (2006.01) |
| *H01L 21/44* | (2006.01) |

(52) U.S. Cl.
USPC ........... 438/275; 438/589; 438/592; 438/300; 438/629; 438/656; 438/926; 257/E21.444

(58) Field of Classification Search
CPC ............... H01L 29/42372; H01L 29/66545; H01L 21/823842
USPC ......... 438/300, 301, 926, 275, 427, 629, 672, 438/689–691, 694, 697, 700, 702, 703, 438/705–707, 714, 738, 758; 257/407, 257/E21.444, E21.635, E21.637, E21.638
See application file for complete search history.

(56) References Cited

U.S. PATENT DOCUMENTS

| | | | |
|---|---|---|---|
| 6,043,151 A * | 3/2000 | Gonzalez et al. ............. | 438/672 |
| 2005/0148137 A1* | 7/2005 | Brask et al. ................... | 438/216 |
| 2006/0071275 A1* | 4/2006 | Brask et al. ................... | 257/350 |
| 2012/0139061 A1* | 6/2012 | Ramachandran et al. .... | 257/410 |
| 2012/0313178 A1* | 12/2012 | Liao et al. ..................... | 257/368 |
| 2013/0005133 A1* | 1/2013 | Lee et al. ...................... | 438/595 |
| 2013/0187236 A1* | 7/2013 | Xie et al. ...................... | 257/369 |
| 2013/0295758 A1* | 11/2013 | Kim .............................. | 438/589 |

* cited by examiner

*Primary Examiner* — Mary Wilczewski
*Assistant Examiner* — Erik T Peterson
(74) *Attorney, Agent, or Firm* — Hunter E. Webb; Keohane & D'Alessandro, PLLC

(57) ABSTRACT

Embodiments of the present invention relate to approaches for forming RMG FinFET semiconductor devices using a low-resistivity metal (e.g., W) as an alternate gap fill metal. Specifically, the semiconductor will typically comprise a set (e.g., one or more) of dielectric stacks formed over a substrate to create one or more trenches/channels (e.g., short/narrow and/or long/wide trenches/channels). A work function layer (e.g., TiN) will be provided over the substrate (e.g., in and around the trenches). A low-resistivity metal gate layer (e.g., W) may then be deposited (e.g., via chemical vapor deposition) and polished (e.g., via chemical-mechanical polishing). Thereafter, the gate metal layer and the work function layer may be etched after the polishing to provide a trench having the etched gate metal layer over the etched work function layer along a bottom surface thereof.

18 Claims, 11 Drawing Sheets

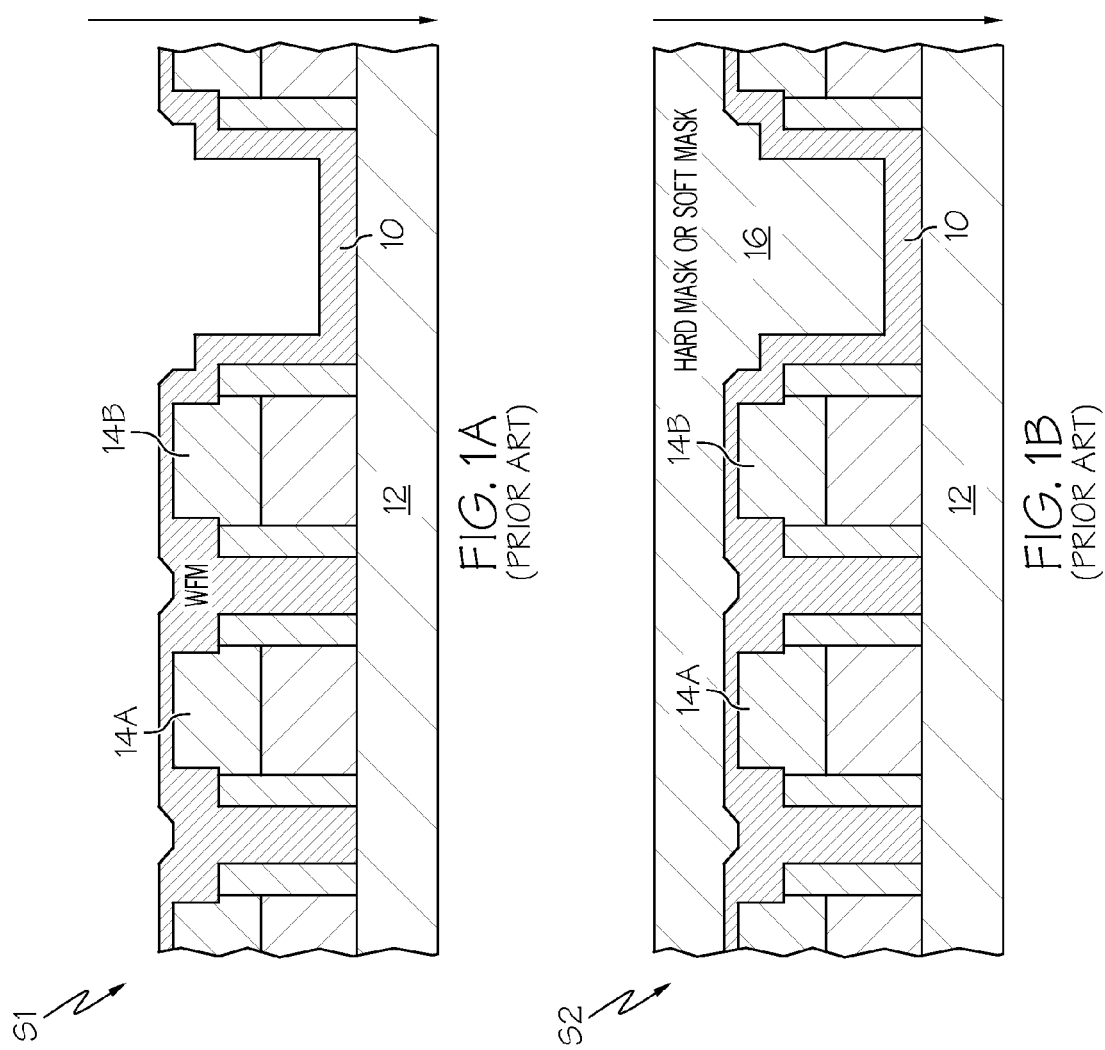

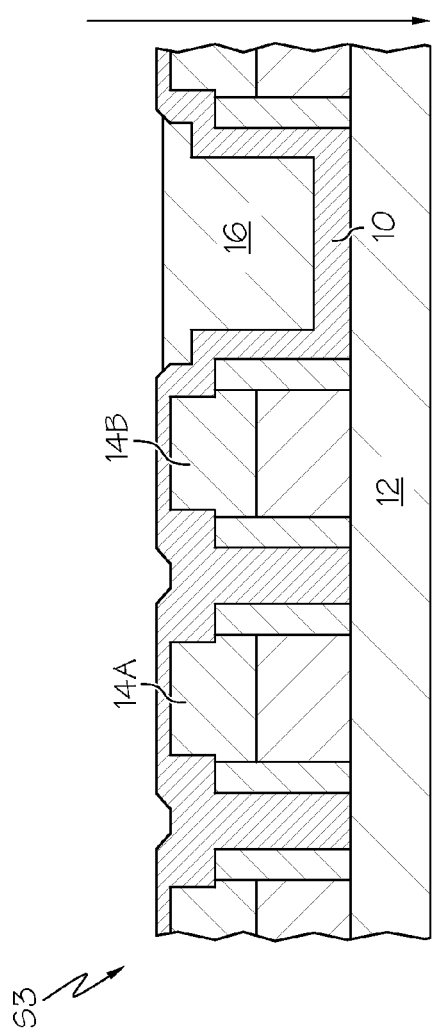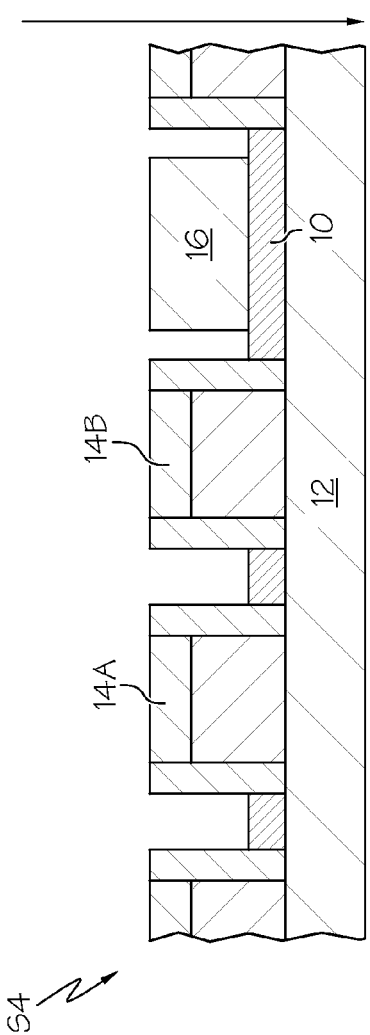

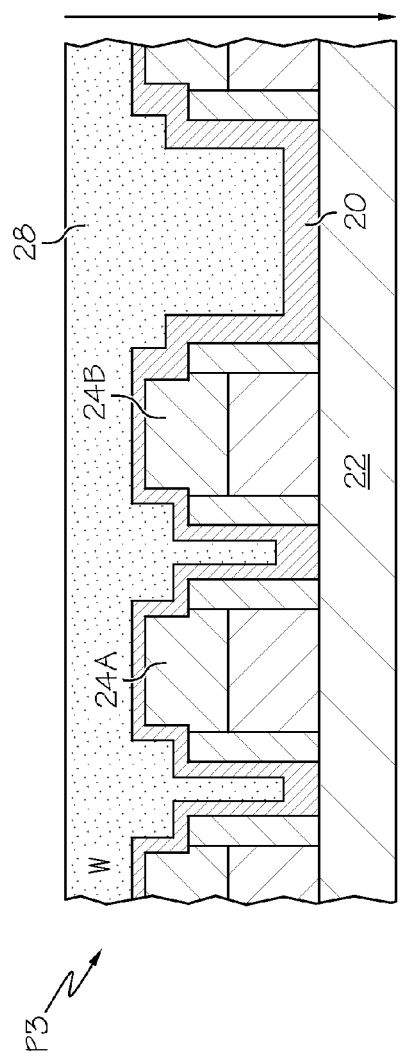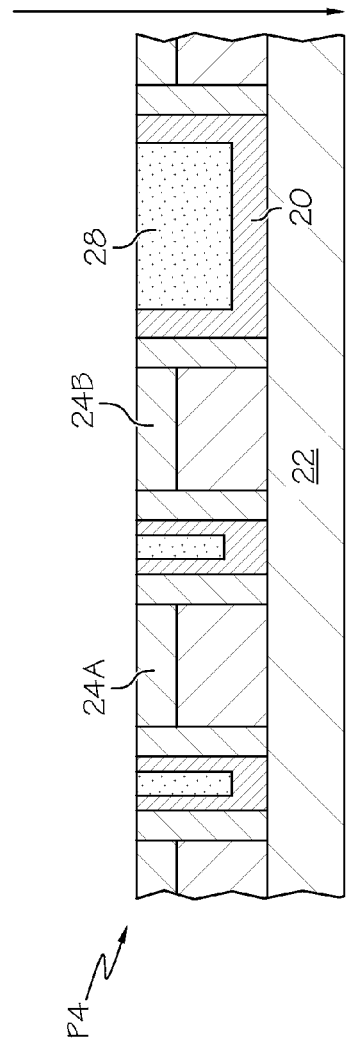
FIG. 2C (PRIOR ART)
FIG. 2D (PRIOR ART)

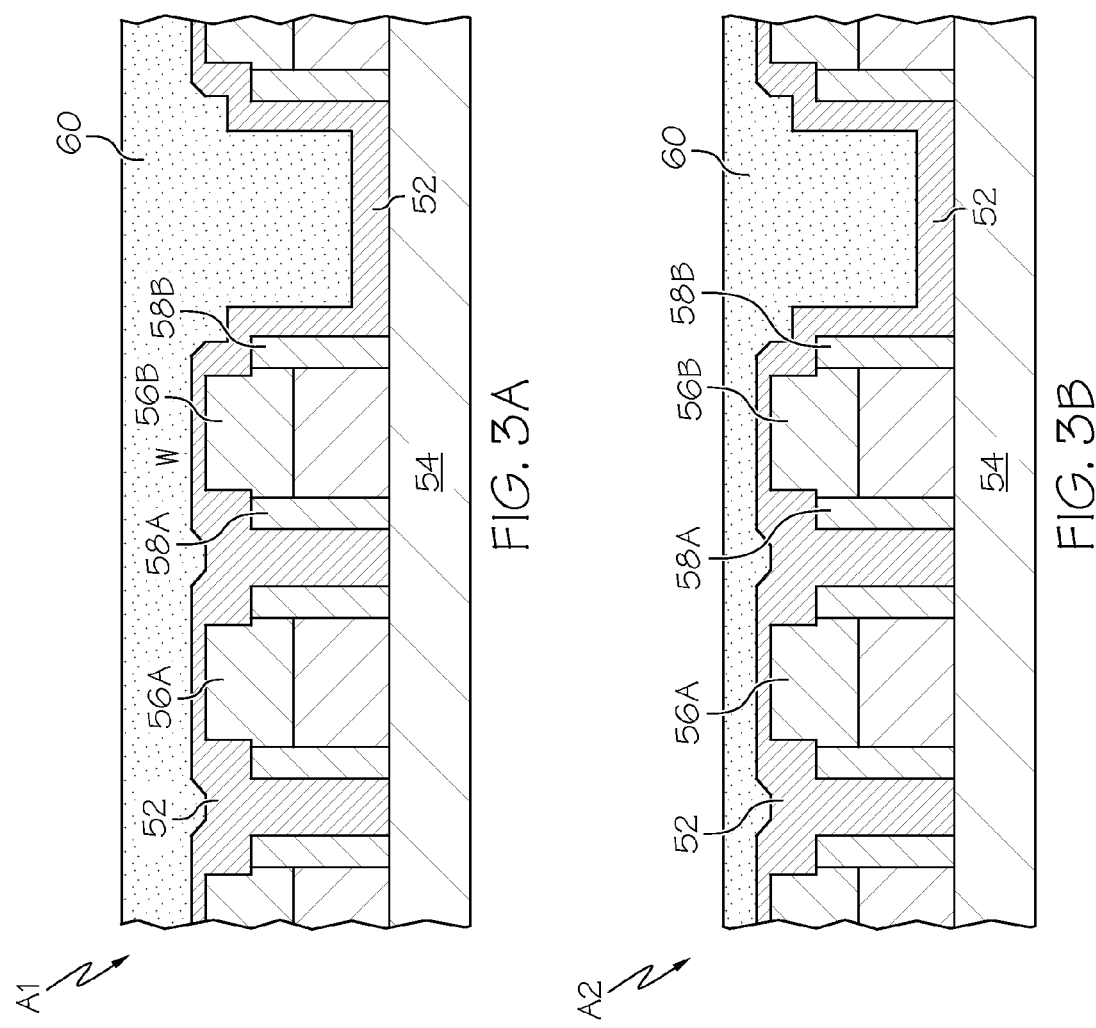

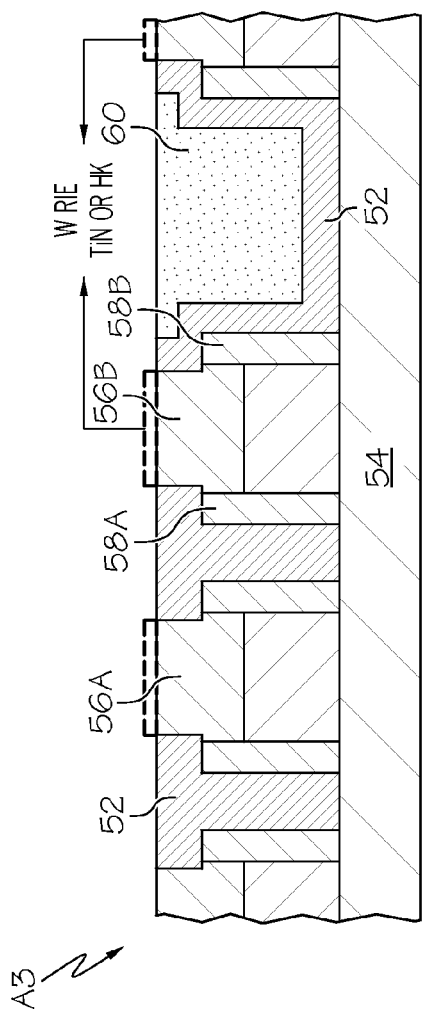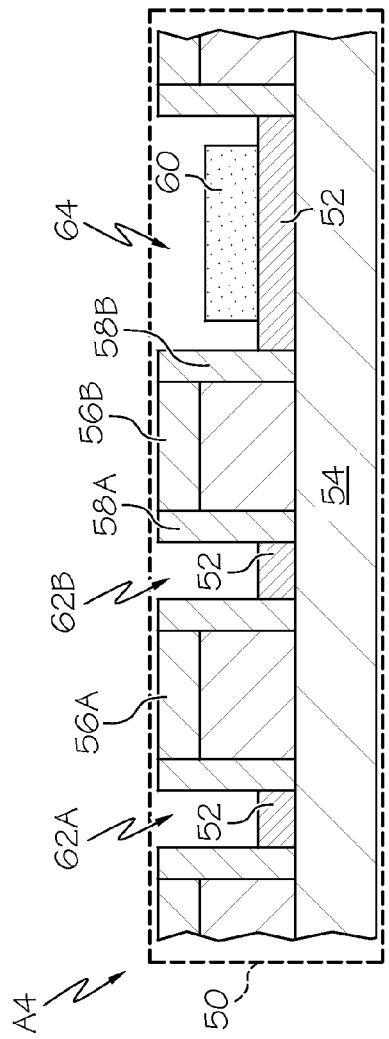
FIG. 3C
FIG. 3D

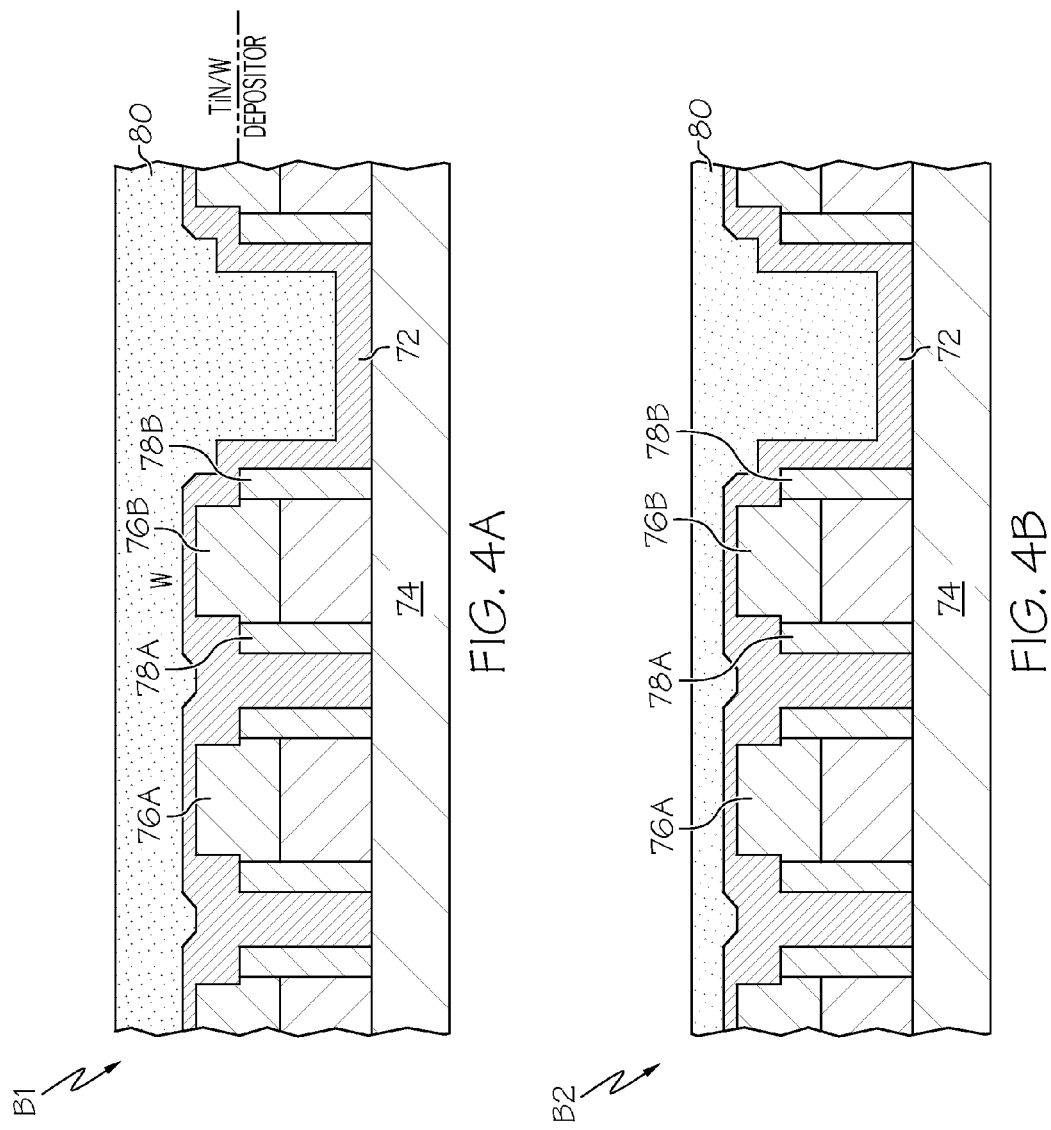

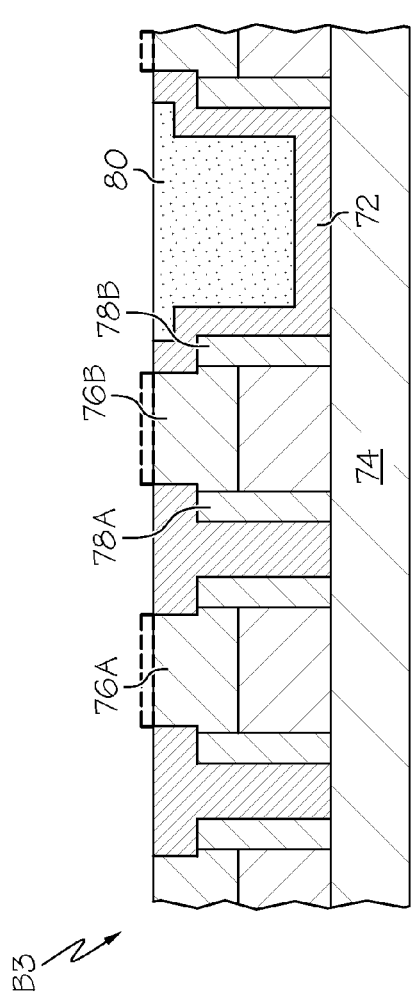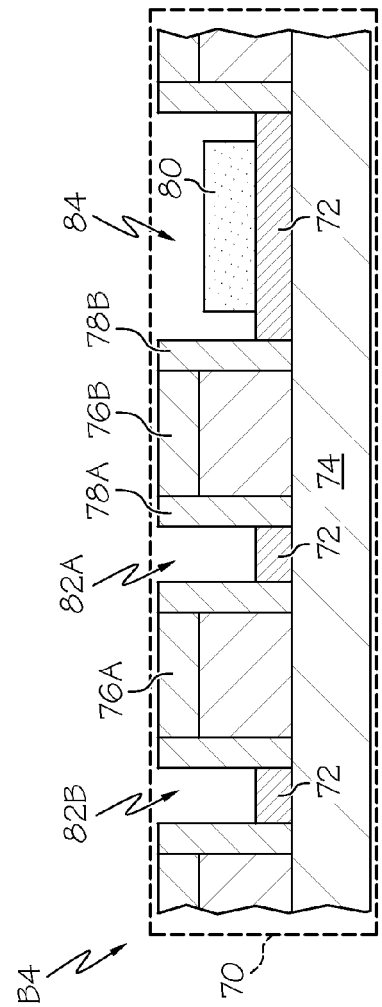

REPLACEMENT METAL GATE SEMICONDUCTOR DEVICE FORMATION USING LOW RESISTIVITY METALS

BACKGROUND

1. Technical Field

This invention relates generally to the field of semiconductors and, more particularly, to approaches for using low resistivity metals (e.g., tungsten (W)) for forming fin-type field effect transistor (FinFET) devices such as replacement metal gate (RMG) FinFET semiconductor devices.

2. Related Art

As the semiconductor industry attempts to utilize 22 nm technology, a transition from planar complimentary metal-oxide semiconductor (CMOS) transistors to a three-dimensional (3D) FinFET device architecture has been considered. Relative to planar transistors, FinFETs offer improved channel control and, therefore, reduced short channel effects. While the gate in a planar transistor sits above the device's channel, the gate of a FinFET typically "wraps" around the channel, providing electrostatic control from both sides. Moreover, a 3D structure introduces new parasitic capacitances and new critical dimensions that must be controlled to optimize performance. Such continuous scaling of CMOS devices requires a noble metal gap fill method in RMG CMOS device fabrication.

Conventional metal gap fill in RMG CMOSFET is typically performed using aluminum (Al) metal. However, uncontrolled Al diffusion into metal gate electrodes may result in metal work function (Vt) variability, causing device performance variation. Thus, tungsten (W) is considered to be used as an alternative gap fill metal. In this case, however, a low work function (WF) (<4.4 eV) of a metal gate electrode is needed for negative channel field effect transistor (NFET) Vt tuning prior to W. As devices scale down in dimensions, the gate length (Lg) of the devices shrinks as well (e.g., down to 20 nm). As such, the resistivity of such low WF metals may be too high to be used in small gate length devices.

SUMMARY

In general, embodiments of the present invention relate to approaches for forming RMG FinFET semiconductor devices using a low-resistivity metal (e.g., W) as an alternate gap fill metal. Specifically, the semiconductor will typically comprise a set (e.g., one or more) of dielectric stacks formed over a substrate to create one or more trenches/channels (e.g., short/narrow and/or long/wide trenches/channels). A work function layer (e.g., TiN) will be provided over the substrate (e.g., in and around the trenches). A low-resistivity metal gate layer (e.g., W) may then be deposited (e.g., via chemical vapor deposition) and polished (e.g., via chemical-mechanical polishing). Thereafter, the gate metal layer and the work function layer may be etched after the polishing to provide a trench having the etched gate metal layer over the etched work function layer along a bottom surface thereof.

A first aspect of the present invention provides a method of forming a semiconductor device, comprising: applying a metal layer over a work function layer of the semiconductor device; polishing the metal layer; and etching the metal layer and the work function layer after the polishing to provide a trench, the trench having the etched metal layer over the etched work function layer along a bottom surface of the trench.

A second aspect of the present invention provides a method of forming a semiconductor device, comprising: depositing a gate metal layer over a work function layer of the semiconductor device; polishing the gate metal layer; performing a first etching of the semiconductor device, the first etching comprising an etching of the gate metal layer and the work function layer; and performing a second etching of the semiconductor device, the second etching comprising an additional etching of the gate metal layer and the work function layer to create a trench in the semiconductor structure, the trench comprising the gate metal layer over the work function layer along a bottom surface of the trench.

A third aspect of the present invention provides a method of forming a FinFET semiconductor device, comprising: applying a gate metal layer over a work function layer of the semiconductor device; polishing the gate metal layer; performing a first etching of the semiconductor device, the first etching comprising an etching of the gate metal layer and the work function layer; and performing a second etching of the semiconductor device, the second etching comprising an additional etching of the gate metal layer and the work function layer to create a trench in the semiconductor structure, the trench comprising a first work function layer along a bottom surface of the trench, a first gate metal layer over a first work function layer, a second work function layer over the first gate metal layer, and a second gate metal layer over the second work function layer.

A fourth aspect of the present invention provides a device, comprising: a substrate; a set of gate stacks positioned on the substrate, the set of gate stacks forming at least one trench in the device; and the at least one trench having a first work function layer positioned on the substrate, a first gate metal layer positioned on the first work function layer, a second work function layer positioned on the first gate metal layer, and a second gate metal layer positioned on the second work function layer.

BRIEF DESCRIPTION OF THE DRAWINGS

These and other features of this invention will be more readily understood from the following detailed description of the various aspects of the invention taken in conjunction with the accompanying drawings in which:

FIGS. 1A-E show a cross-section view of an interconnect device during its formation using a hard mask layer;

FIGS. 2A-D show a cross-section view of an interconnect device during its formation using a blocking mask layer;

FIGS. 3A-D show a cross-section view of an interconnect device during its formation according to an embodiment of the present invention;

FIGS. 4A-D show a cross-section view of an interconnect device during its formation according to an embodiment of the present invention;

Figure 1E:
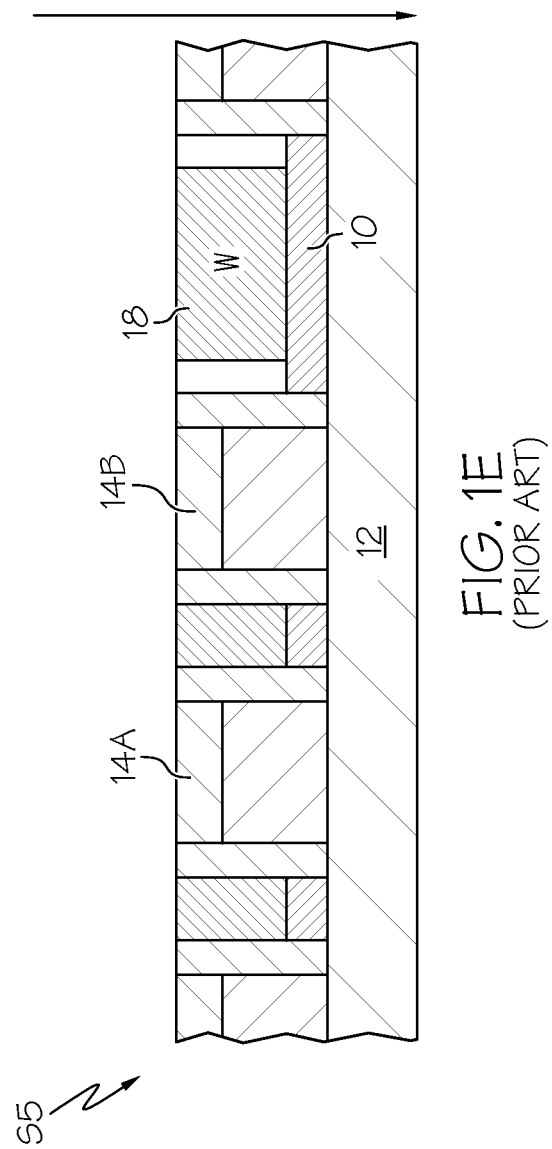
Figures 2A, 2B:
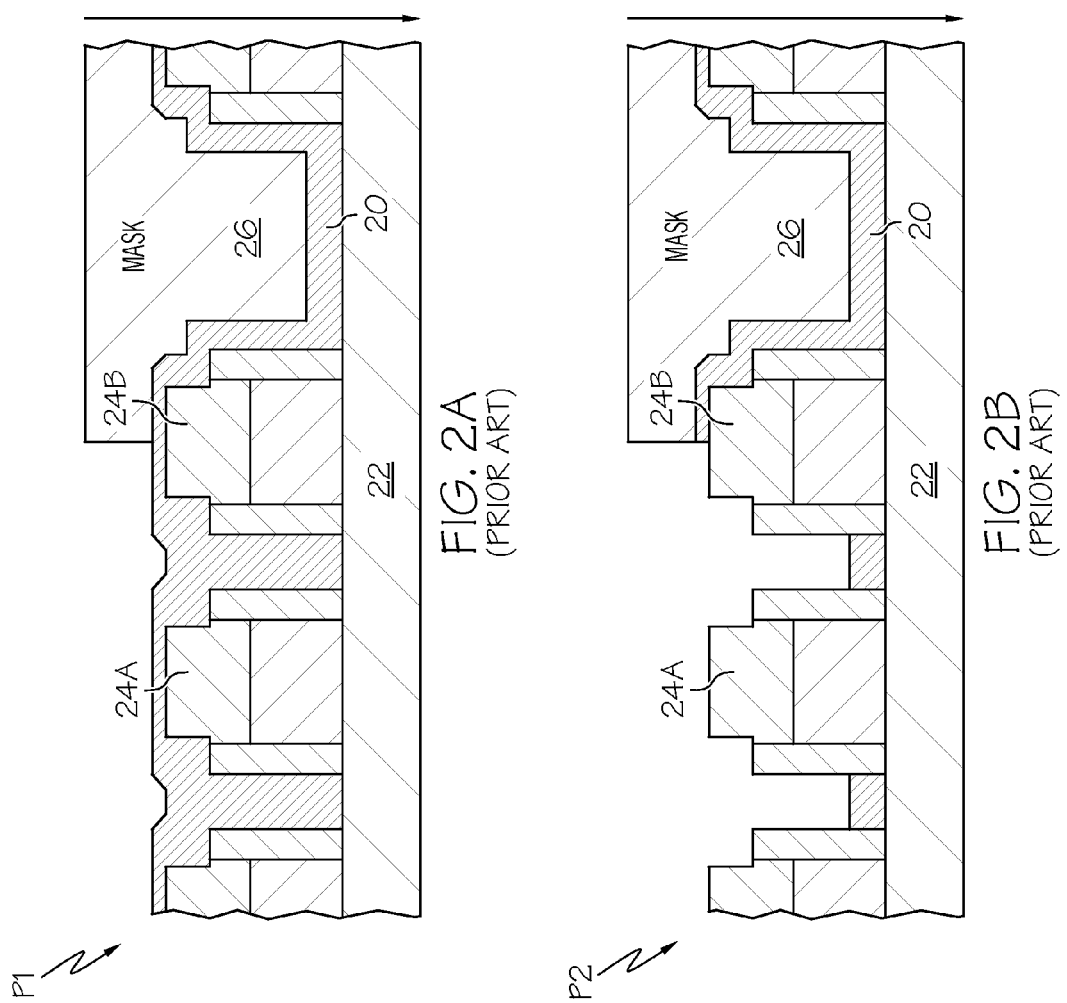

The drawings are not necessarily to scale. The drawings are merely representations, not intended to portray specific parameters of the invention. The drawings are intended to depict only typical embodiments of the invention, and therefore should not be considered as limiting in scope. In the drawings, like numbering represents like elements.

DETAILED DESCRIPTION

Illustrative embodiments will now be described more fully herein with reference to the accompanying drawings, in which embodiments are shown. This disclosure may, however, be embodied in many different forms and should not be construed as limited to the embodiments set forth herein. Rather, these embodiments are provided so that this disclosure will be thorough and complete and will fully convey the scope of this disclosure to those skilled in the art. In the description, details of well-known features and techniques may be omitted to avoid unnecessarily obscuring the presented embodiments.

The terminology used herein is for the purpose of describing particular embodiments only and is not intended to be limiting of this disclosure. As used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. The term "set" is intended to mean a quantity of at least one. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure (e.g., a first layer) is present on a second element, such as a second structure (e.g. a second layer) wherein intervening elements, such as an interface structure (e.g. interface layer) may be present between the first element and the second element.

As indicated above, embodiments of the present invention relate to approaches for forming RMG FinFET semiconductor devices using a low-resistivity metal (e.g., W) as an alternate gap fill metal. Specifically, the semiconductor will typically include a set (e.g., one or more) of dielectric stacks formed over a substrate to create one or more trenches/channels (e.g., short/narrow and/or long/wide trenches/channels). A work function layer (e.g., TiN) will be provided over the substrate (e.g., in and around the trenches). A low-resistivity metal gate layer (e.g., W) may then be deposited (e.g., via chemical vapor deposition) and polished (e.g., via chemical-mechanical polishing). Thereafter, the gate metal layer and the work function layer may be etched after the polishing to provide a trench having the etched gate metal layer over the etched work function layer along a bottom surface thereof.

A common way is to etch away the part of WF metals and replace the etched part with a low resistivity metal such as W (tungsten). The metal etching process should not attack high-k underneath WF metal. The metal thickness should be thick enough to fill out the gate trench hole so that the metal etching process cannot hit bottom metal near high-k during metal etch (because etching is done far away from the bottom). However, this is applicable for a short gate length area. For larger and longer devices there are thin metals on top of high-k. Thus, such larger and longer gate devices should be protected from WF metal etching. There are several approaches to protect larger and longer gate devices.

Referring now to FIGS. 1A-E, a previous approach for device fabrication is shown. As shown, a work function metal layer 10 may be applied over a substrate 12 and dielectric stacks 14A-B (S1), over which a mask layer 16 may be provided (S2). The mask layer 16 may then be etched (S3), and the work function layer 10 (and remaining mask layer 16) may be selectively removed (S4) to reveal trenches. Thereafter, a metal layer 18 may be applied to fill the trenches. Unfortunately, under the process of steps S1-S5, it may be difficult to apply hard mask or soft mask materials on a larger gate area. As such, an additional step may be needed to remove such mask materials after work function layer etching occurs.

Referring now to FIGS. 2A-D, another previous approach for device fabrication is shown. As shown, a work function metal layer 20 may be applied over a substrate 22 and dielectric stacks 24A-B (P1), over which a blocking mask layer 26 may be provided (P2). The work function layer 20 may be removed around the mask (P2). The mask layer 26 may then be removed and a metal gate layer 28 may thereafter be applied (P3) to fill the remaining trenches. The metal gate layer 28 may then be etched to finish the device (P4). The process of steps P1-P4 unfortunately requires an additional blocking mask which not only adds to overall fabrication costs, but also complicates lithography, mask design, alignment, and/or measurement.

Referring now to FIGS. 3A-D, an approach for forming/fabricating a semiconductor device/interconnect (device 50) according to an embodiment of the present invention is shown. In general, device 50 includes a RMG FinFET device having a set of trenches/channels (e.g., short/narrow trenches 62A-B, long/wide trench 64, etc.). Regardless, the progression of forming device 50 is shown throughout steps A1-A4. As shown, in step A1, a work function layer 52 (e.g., TiN) is applied over substrate 54 and around dielectric stacks 56A-B, and spacers 58A-B. A (low resistivity) gate metal layer 60 (e.g., W) may then be deposited (e.g., via chemical vapor deposition) over work function layer 52. In step A2, the gate metal layer 60 may be polished (e.g., via chemical mechanical polishing). In steps A3-A4, the gate metal layer 60 and the work function layer 52 may be etched (e.g., in an ion etch chamber) after the polishing to provide trenches 62A-B and 64. As shown, trench 64 has the etched gate metal layer 60 positioned over the etched work function layer 52 along a bottom surface of the trench 64, while etched work function layer 52 remains along bottoms surfaces of trenches 62A-B.

Referring now to FIGS. 4A-D, an approach for forming/fabricating a semiconductor device/interconnect (device 70) according to an embodiment of the present invention is shown. In general, device 70 includes a RMG FinFET device having a set of trenches/channels (e.g., short/narrow trenches 82A-B, long/wide trench 84, etc.). Regardless, the progression of forming device 70 is shown throughout steps B1-B4. As shown, in step B1, a low resistivity gate metal layer 80 (e.g., W) is deposited over a work function layer 72 (e.g., TiN), which itself is applied over a substrate 74, dielectric stacks 76A-B, and spacers 78A-B of device 70. In step B2, the gate metal layer 80 is polished. In step B3-B4, multiple etchings of device 70 are performed. For example, in step B3, a first etching includes an etching of the gate metal layer 80 and the work function layer 72. In step B4, a second etching, including an additional etching of the gate metal layer 80 and the work function layer 72, is performed. This second etching results in the creation of trenches 82A-B and 84. Long trench 84 includes the gate metal layer 80 over the work function layer 72 along a bottom surface of the trench 84, while short trenches 82A-B include work function layer 72 along the bottom surfaces thereof.

Figure 5A:
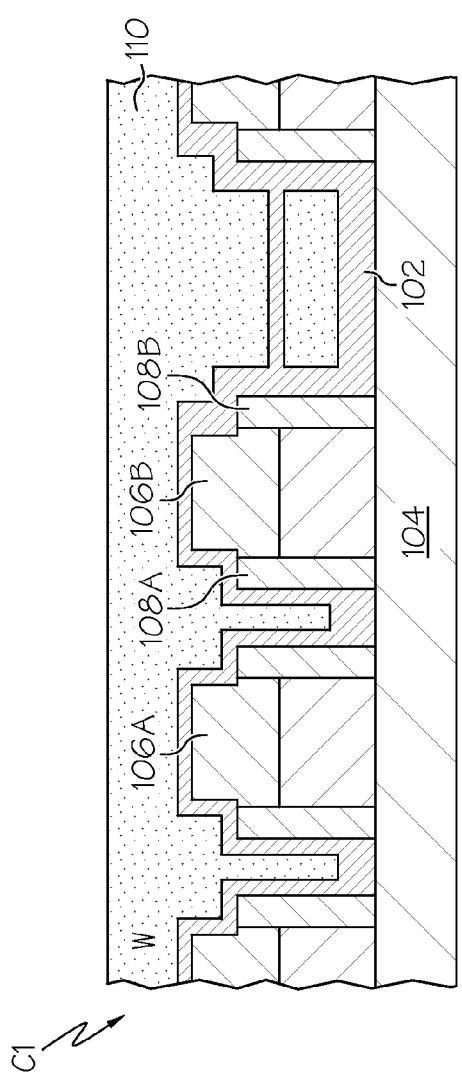
FIGS. 5A-B show a cross-sectional view of an interconnect device after its manufacture according to illustrative embodiments.
Figure 5B:
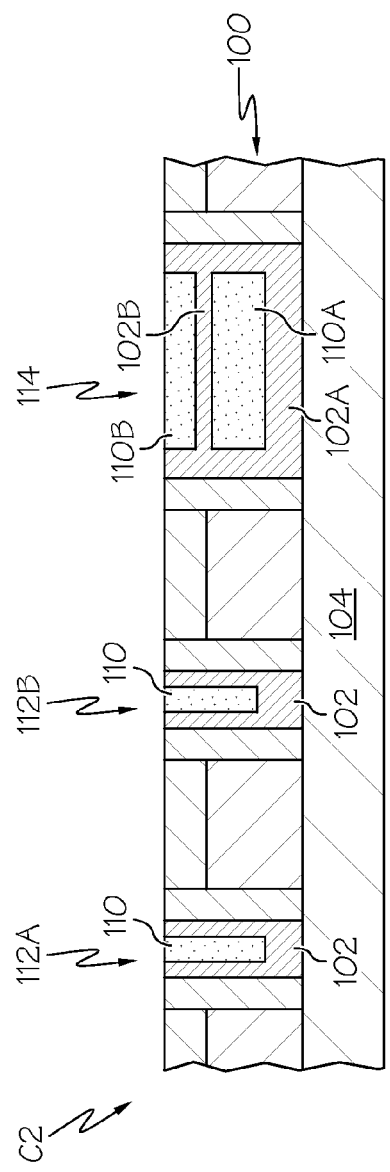

Referring now to FIGS. 5A-B, an approach for forming/fabricating a semiconductor device/interconnect (device 100) according to an embodiment of the present invention is shown. In general, device 100 includes a RMG FinFET device having a set of trenches/channels (e.g., short/narrow trenches 112A-B, long/wide trench 114, etc.). Regardless, the progression of forming device 70 is shown in steps C1-C2 (and may be similar to steps A1-A4 of FIG. 3 and/or steps B1-B4 of FIG. 4). In general, a work function layer (TiN) 102 is applied over substrate 104, dielectric stacks 106A-B, and spacers 108A-B. A high resistivity gate metal layer 110 (e.g., W) is then applied (e.g., via CVD) over work function layer 102. Similar to FIGS. 3 and/or 4, gate metal layer 110 may then be polished, and one or more etchings steps may be performed on gate metal layer 110 and work function layer 102. The etchings(s) will result in work function layer 102 and gate metal layer 110 residing in short trenches 112A-B. However, as shown, long trench 114 will have multiple, alternating layers of work function layer 102A-B and gate metal layer 110A-B as shown.

Figure 6:
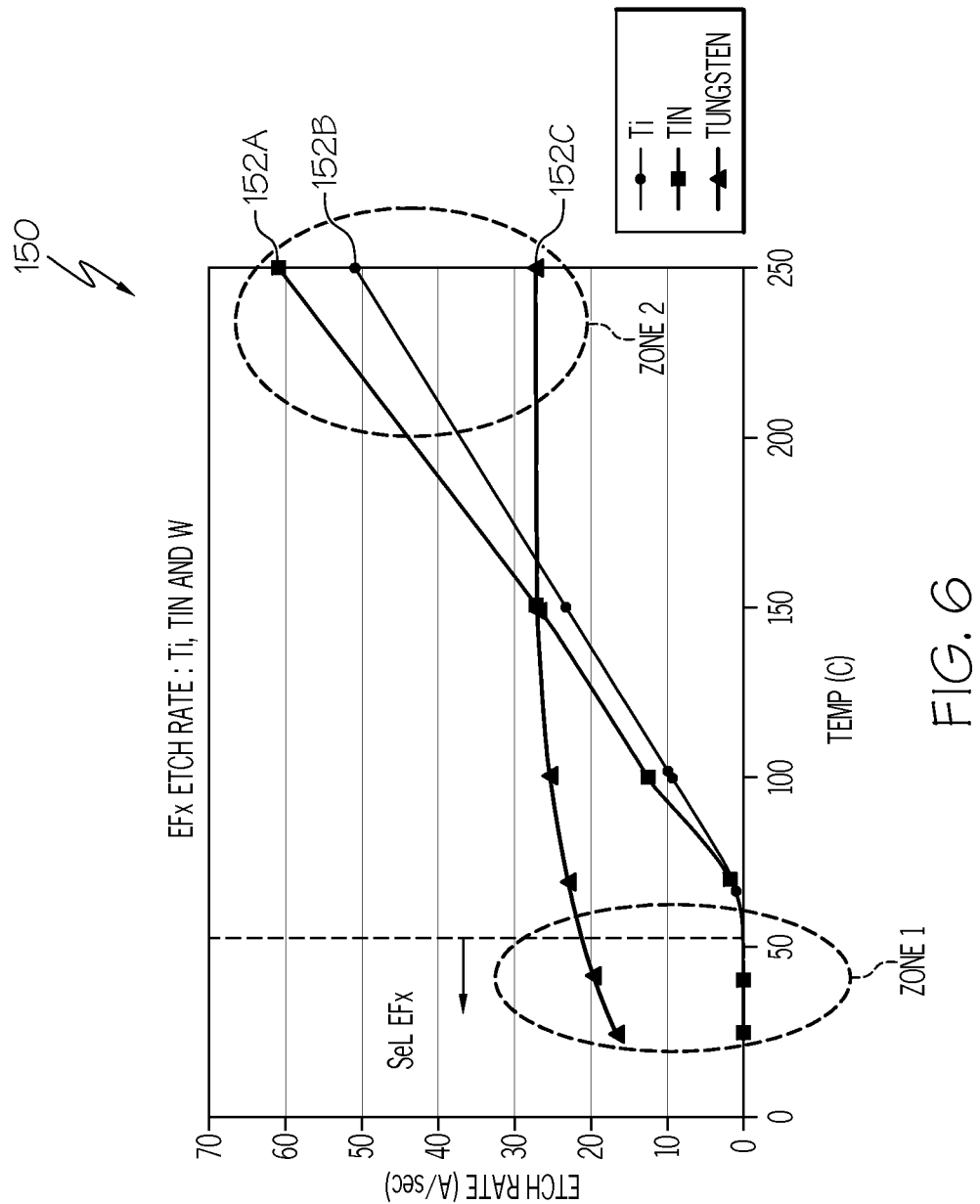
FIG. 6 shows a graph of etch rates versus temperature for various materials according to illustrative embodiments.

Referring now to FIG. 6, a graph 150 of etch rates versus temperature is shown. Specifically, graph 150 shows etch rates at various temperatures for TiN 152A, Ti 152B, and W 152C. As shown, W etches at the highest rate at a temperature of approximately 50° (C.), which makes it highly useable in the processes described herein.

In various embodiments, design tools can be provided and configured to create the data sets used to pattern the semiconductor layers as described herein. For example data sets can be created to generate photomasks used during lithography operations to pattern the layers for structures as described herein. Such design tools can include a collection of one or more modules and can also include hardware, software, or a combination thereof. Thus, for example, a tool can be a collection of one or more software modules, hardware modules, software/hardware modules or any combination or permutation thereof. As another example, a tool can be a computing device or other appliance on which software runs or in which hardware is implemented. As used herein, a module might be implemented utilizing any form of hardware, software, or a combination thereof. For example, one or more processors, controllers, application-specific integrated circuits (ASIC), programmable logic arrays (PLA)s, logical components, software routines, or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A method of forming a semiconductor device, comprising:
applying a metal layer over a work function layer that is over a set of dielectric stacks and a first and second trench of the semiconductor device;
polishing the metal layer; and
etching the metal layer and the work function layer in the trenches after the polishing to provide recesses in the first trench and the second trench, the first trench having the etched metal layer over the etched work function layer along a bottom surface of the first trench and the second trench having the etched work function layer with no etched metal layer over the etched work function layer along a bottom surface of the second trench.

2. The method of claim 1, wherein the metal layer comprises tungsten (W).

3. The method of claim 1, the polishing comprising a chemical mechanical polishing.

4. The method of claim 1, the etching being performed in an ion etch chamber.

5. The method of claim 1, the work function layer comprising titanium nitride (TiN).

6. The method of claim 1, forming the first trench comprising a relatively long length channel with respect to at least one other trench of the semiconductor device.

7. A semiconductor device formed according to the method of claim 1, the semiconductor device comprising a FinFET semiconductor device.

8. A method of forming a semiconductor device, comprising:
depositing a gate metal layer over a work function layer that is over a set of dielectric stacks and a first and second trench of the semiconductor device;
polishing the gate metal layer;
performing a first etching of the semiconductor device, the first etching comprising an etching of the gate metal layer and the work function layer; and
performing a second etching of the semiconductor device, the second etching comprising an additional etching of the gate metal layer and the work function layer in the trenches to create recesses in the first trench and the second trench in the semiconductor device, the first trench comprising the gate metal layer over the work function layer along a bottom surface of the first trench, and the second trench comprising the work function layer with no gate metal layer over the work function layer along a bottom surface of the second trench.

9. The method of claim 8, the gate metal comprising tungsten (W), and the work function layer comprising titanium nitride (TiN).

10. The method of claim 8, the polishing comprising a chemical mechanical polishing.

11. The method of claim 8, forming the first trench comprising a relatively long length channel with respect to at least one other trench of the semiconductor device.

12. A semiconductor device formed according to the method of claim 8, the semiconductor device comprising at least one long length channel having the gate metal layer over the work function layer, and at least one narrow length channel having a work function layer, wherein the length of the long length channel is greater than the length of the narrow length channel.

13. A method of forming a FinFET semiconductor device, comprising:
   applying a first gate metal layer over a first work function layer that is over a set of dielectric stacks and a first and second trench of the semiconductor device;
   polishing the first gate metal layer;
   performing a first etching of the semiconductor device, the first etching comprising an etching of the first gate metal layer and the first work function layer; and
   performing a second etching of the semiconductor device, the second etching comprising an additional etching of the first gate metal layer and the first work function layer in the trenches to create recesses in the first trench and the second trench in the semiconductor device,
   applying a second work function layer over the first gate metal layer, and applying a second gate metal layer over the second work function layer; wherein
   the first trench comprises the first work function layer along a bottom surface of the first trench, the first gate metal layer over the first work function layer, the second work function layer over the first gate metal layer, and the second gate metal layer over the second work function layer; and wherein
   the second trench comprises the first work function layer along a bottom surface of the first trench and a first gate metal layer over the first work function layer with no second gate metal layer and second work function layer.

14. The method of claim 13, the first gate metal comprising tungsten (W), and the first work function layer comprising titanium nitride (TiN).

15. The method of claim 13, the polishing comprising a chemical mechanical polishing.

16. The method of claim 13, forming the first trench comprising a relatively long length channel with respect to at least one other trench of the FinFET semiconductor device.

17. A FinFET semiconductor device formed according to the method of claim 13, the semiconductor device comprising at least one relatively long length channel and at least one relatively narrow length channel.

18. The FinFET semiconductor device of claim 17, comprising a replacement metal gate FinFET semiconductor device.

* * * * *